(12) United States Patent
Wang et al.

(10) Patent No.: US 10,629,632 B2
(45) Date of Patent: Apr. 21, 2020

(54) DISPLAY DEVICE

(71) Applicant: InnoLux Corporation, Miao-Li County (TW)

(72) Inventors: An-Chang Wang, Miao-Li County (TW); Bo-Chin Tsuei, Miao-Li County (TW); Hsia-Ching Chu, Miao-Li County (TW); Ming-Chien Sun, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/397,100

(22) Filed: Apr. 29, 2019

(65) Prior Publication Data

US 2019/0259781 A1 Aug. 22, 2019

Related U.S. Application Data

(63) Continuation of application No. 15/343,263, filed on Nov. 4, 2016, now Pat. No. 10,319,746.

(30) Foreign Application Priority Data

Nov. 5, 2015 (CN) .......................... 2015 1 0744136

(51) Int. Cl.
*H01L 27/12* (2006.01)
*H01L 29/417* (2006.01)
*G02F 1/1368* (2006.01)

(52) U.S. Cl.
CPC ........ *H01L 27/124* (2013.01); *H01L 27/1218* (2013.01); *H01L 29/41733* (2013.01); *G02F 1/1368* (2013.01)

(58) Field of Classification Search
CPC .. H01L 27/124; H01L 27/1218; G02F 1/1368
See application file for complete search history.

(56) References Cited

U.S. PATENT DOCUMENTS

| 6,977,422 | B2 * | 12/2005 | Kido .................... H01L 21/0274 257/401 |
| 7,737,446 | B2 * | 6/2010 | Park ................... H01L 29/78696 257/59 |
| 8,179,511 | B2 * | 5/2012 | Kang ................ G02F 1/134363 349/141 |

(Continued)

*Primary Examiner* — Peter Bradford
(74) *Attorney, Agent, or Firm* — Bacon & Thomas, PLLC

(57) ABSTRACT

A display device is disclosed, which includes: a substrate; a first metal conductive layer disposed on the substrate; a semiconductor layer disposed on the first metal conductive layer; and a second metal conductive layer disposed on the semiconductor layer and including a data line, a first part and a second part separated from the first part, the data line with a data extending direction connected to the second part. A first extending direction is a direction that the first part extends toward the second part, a first region is a region that the first part overlaps the first metal conductive layer, the first part has a first maximum breadth outside the first region along the data extending direction and a second maximum breadth inside the first region along a direction substantially perpendicular to the first extending direction, and the first maximum breadth is greater than the second maximum breadth.

18 Claims, 7 Drawing Sheets

(56) References Cited

U.S. PATENT DOCUMENTS

| | | | |
|---|---|---|---|
| 8,614,474 B2* | 12/2013 | Tomida | H01L 27/1214 257/314 |
| 10,038,014 B2* | 7/2018 | Ishizaki | H01L 29/0847 |
| 2003/0043307 A1* | 3/2003 | Nakayama | G02F 1/1368 349/43 |
| 2010/0200843 A1* | 8/2010 | Arai | H01L 27/3262 257/40 |
| 2011/0095294 A1* | 4/2011 | Lee | H01L 27/124 257/59 |
| 2011/0133194 A1* | 6/2011 | Liu | H01L 27/124 257/59 |
| 2011/0248271 A1* | 10/2011 | Choo | H01L 21/26513 257/59 |
| 2012/0001189 A1* | 1/2012 | Matsubara | G02F 1/136286 257/59 |
| 2013/0265531 A1* | 10/2013 | Mori | G02F 1/134309 349/106 |
| 2013/0299827 A1* | 11/2013 | Yamazaki | H01L 27/1225 257/43 |
| 2014/0077298 A1* | 3/2014 | Ma | G02F 1/1362 257/347 |
| 2014/0191238 A1* | 7/2014 | Hwang | H01L 27/1214 257/59 |
| 2014/0319526 A1* | 10/2014 | Choi | H01L 29/41733 257/59 |
| 2015/0262536 A1 | 9/2015 | Chen et al. | |
| 2016/0027807 A1* | 1/2016 | Zhang | H01L 27/124 257/72 |
| 2016/0111280 A1* | 4/2016 | Yamazaki | H01L 21/02488 438/104 |
| 2017/0023837 A1* | 1/2017 | Shin | G02F 1/136227 |
| 2017/0133404 A1 | 5/2017 | Wang et al. | |
| 2017/0301702 A1* | 10/2017 | Kim | G09G 3/3677 |

\* cited by examiner

DISPLAY DEVICE

CROSS REFERENCE TO RELATED APPLICATION

This application claims the benefits of the Chinese Patent Application Serial Number 201510744136.8, filed on Nov. 5, 2015, the subject matter of which is incorporated herein by reference.

This application is a continuation (CA) of U.S. patent application for "Display device", U.S. application Ser. No. 15/343,263 filed Nov. 4, 2016, and the subject matter of which is incorporated herein by reference.

BACKGROUND

1. Field of the Disclosure

The present disclosure relates to a display device and, more particularly, to a display device in which a source or drain electrode has specific width or length to ensure a switch performance of a thin film transistor structure and a display quality of the display device.

2. Description of Related Art

In recent years, all the display devices are developed toward having small volume, thin thickness or light weight as the display techniques progresses. Hence, a conventional cathode ray tube (CRT) display is gradually replaced by a liquid crystal display (LCD) device, an organic light emitting diode (OLED) display device or the like. In addition, with the development of flexible substrates, the LCD device and the OLED display device are not limited to conventional display devices, but also can be flexible display devices equipped with flexible substrates. The conventional or flexible LCD device or the conventional or flexible OLED display devices can be applied to various fields. For example, the daily used devices such as cell phones, notebooks, video cameras, cameras, music players, navigation devices, and televisions are equipped with these display devices.

Although the LCD devices and OLED display devices are commercially available, and especially the techniques for the LCD devices are well matured, every manufacturer is desired to develop display devices with improved display quality to meet customers' requirement for high display quality as the display devices developed. For the conventional display devices or the flexible display devices, the structure of the thin film transistors on the display region is one factor related to the overall efficiency of the display device.

Therefore, it is desirable to provide an improved thin film transistor structure on the display region to further enhance the display quality of the display device.

SUMMARY

An object of the present disclosure is to provide a display device, wherein a first part of the second metal conductive layer as a source or drain electrode has a specific width or length, to ensure the switch performances of the thin film transistor structure or assure the optical property of the display device.

Hereinafter, the first part can be a source or drain electrode; if the first part is defined as a source electrode, the second part is defined as a drain electrode; and vice versa.

The display device of the present disclosure comprises: a substrate; a first metal conductive layer disposed on the substrate; a semiconductor layer disposed on the first metal conductive layer and having a top surface; and a second metal conductive layer disposed on the top surface, wherein the second metal conductive layer comprises a first part and a second part, the first part extends toward the second part, the first part is apart from the second part in a distance and forms a channel region with the semiconductor layer, and the second metal conductive layer, the first metal conductive layer and the semiconductor layer forms a thin film transistor structure. Herein, a first extending direction is defined as a direction that the first part extends toward the second part, a second direction is defined as a direction vertical to the first extending direction, a first region is defined as a region that the first part overlaps the first metal conductive layer, a second region is defined as a region that the first part overlaps the semiconductor layer, the first part has a maximum length (b) in the first region along the first extending direction, the first part has a maximum width (a) in the second region along the second direction, and the maximum length is greater than the maximum width and less than or equal to twice of the maximum width (a<b≤2a).

Hence, in the display device of the present disclosure, the first part of the second metal conductive layer as a source electrode is designed to have a specific width or length. When the first part has the specific width or length, the area of the second region between the first part and the semiconductor layer can be ensured, and the total length of the edges of the first part in this second region can also be kept. Therefore, the switch performance of the TFT structure or the optical property of the display device can be assured.

Other objects, advantages, and novel features of the disclosure will become more apparent from the following detailed description when taken in conjunction with the accompanying drawings.

DETAILED DESCRIPTION OF THE EMBODIMENT

The present disclosure has been described in an illustrative manner, and it is to be understood that the terminology used is intended to be in the nature of description rather than of limitation. Many modifications and variations of the present disclosure are possible in light of the above teachings. Therefore, it is to be understood that within the scope of the appended claims, the disclosure may be practiced otherwise than as specifically described.

Furthermore, the ordinal numbers such as "first" and "second" used in the present specification and the appended claims are used to modify the units in the appended claims. The ordinal numbers themselves do not mean or represent the claimed units having ordinal numbers, and do not represent the order of one claimed unit to another claimed unit or the sequence of the manufacturing process. The ordinal numbers are used only for naming one claimed unit to clearly distinguish the claimed unit from the other claimed unit having the same term.

Figure 1:
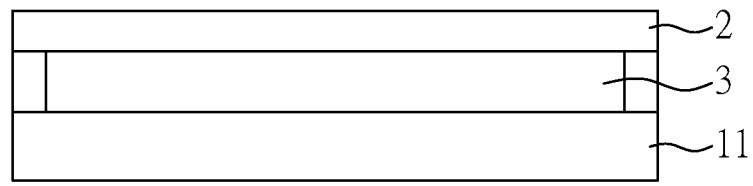
FIG. 1 is a cross-sectional view of a display device according an embodiment of the present disclosure.

FIG. 1 is a cross-sectional view of a display device according an embodiment of the present disclosure. The display device of the present embodiment comprises: a substrate 11; a counter substrate 2 opposite to the substrate 11; and a display medium layer 3 disposed between the substrate 11 and the counter substrate 2. In the present embodiment, the substrate 11 can be a TFT substrate with TFT structures (not shown in the figure) disposed thereon, and the counter substrate 2 can be a color filter substrate with a color filter layer (not shown in the figure) disposed thereon. However, in other embodiment of the present disclosure, the color filter layer (not shown in the figure) can also be disposed on the substrate 11; and in this case, the substrate 11 is a color filter on array (COA) substrate. In addition, the display medium layer 3 in the display device of the present embodiment can be a liquid crystal layer, an organic light emitting diode layer, a light emitting diode layer, or a quantum dot layer. When the display medium layer 3 in the display device of the present embodiment is a liquid crystal layer, the display device of the present embodiment may further comprise a backlight module disposed below the substrate 11. Hereinafter, the structure of the TFT structure on the substrate 11 is described in detail.

In the present embodiment and other embodiments of the present disclosure, the display device may be not equipped with the counter substrate 2. In addition, the substrate 11 can comprise a flexible substrate, and the material of the flexible substrate can be plastic or other material capable of forming the flexible substrate.

Figure 2A:
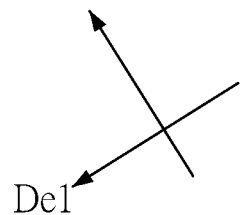
FIGS. 2A and 2B are top views of a TFT structure according to an embodiment of the present disclosure.
Figure 2B:
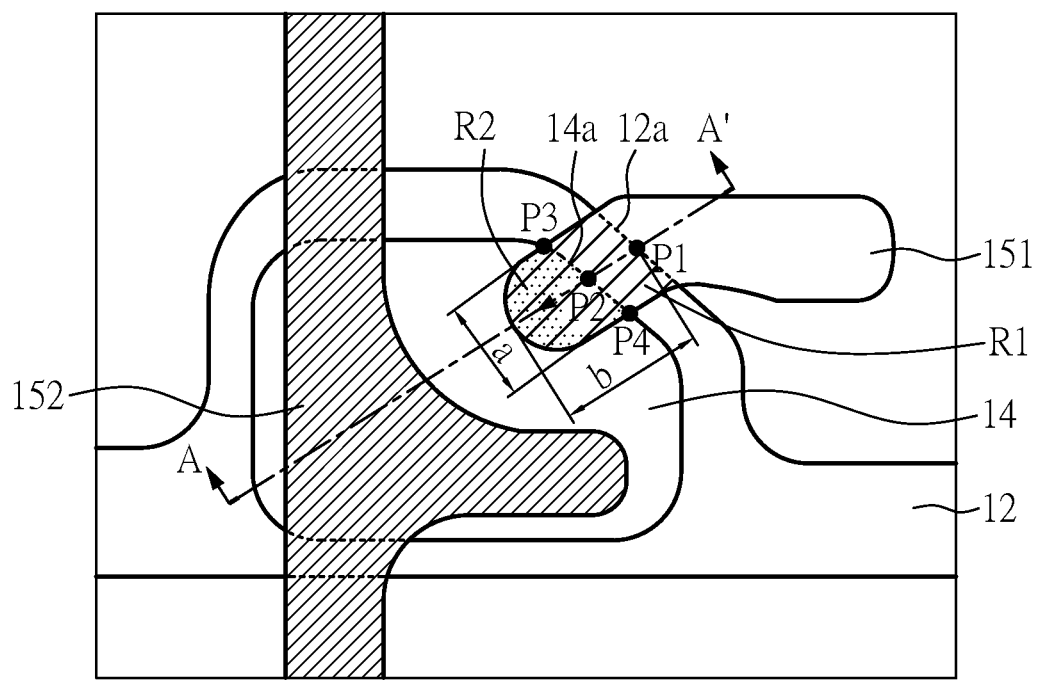
Figure 3:
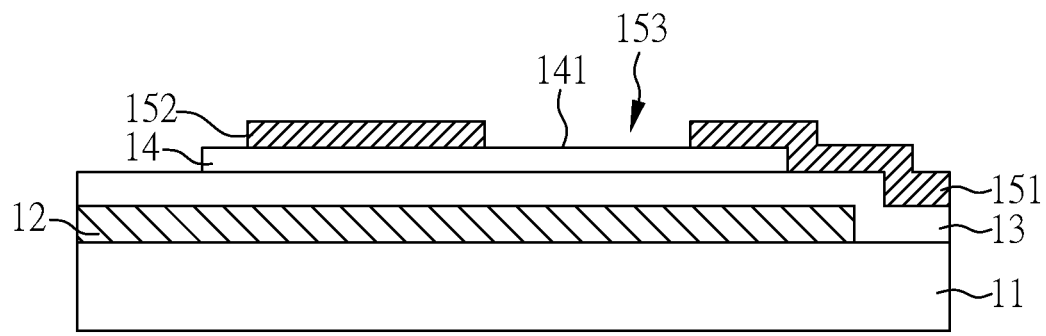
FIG. 3 is a cross-sectional view of a TFT structure according to an embodiment of the present disclosure.

FIGS. 2A to 3 are respectively top views and a cross-sectional view of a TFT structure according to an embodiment of the present disclosure, wherein FIG. 3 is a cross-sectional view of FIGS. 2A and 2B along a section line A-A'. FIGS. 2A and 2B are the same top views except that the filling patterns are different. The display device of the present embodiment comprises: a substrate 11; a first metal conductive layer 12 disposed on the substrate 11; an insulating layer 13 disposed on the first metal conductive layer 12; a semiconductor layer 14 disposed on the insulating layer 13 and the first metal conductive layer 12 and having a top surface 141; and a second metal conductive layer disposed on the top surface 141 and configured a TFT structure with the first metal conductive layer 12 and the semiconductor layer 14, wherein the second metal conductive layer comprises a first part 151 and a second part 152, the first part 151 extends toward the second part 152, and the first part 151 is apart from the second part 152 in a distance and forms a channel region 153 with the semiconductor layer 14. Herein, the channel region 153 is located in the semiconductor layer 14.

In the present embodiment, the substrate 11 can comprise any substrate material such as glass, plastic or other flexible material; but the present disclosure is not limited thereto. The insulating layer 13 can comprise any insulating material such as oxides, nitrides, or nitroxides; in the present embodiment, the material of the insulating layer 13 is silicon nitride (SiNx). The first metal conductive layer 12 and the second metal conductive layer (including the first part 151 and the second part 152) can comprise any conductive material, such as metals, alloys, metal oxides, metal nitroxides or other electrode material. In addition, the semiconductor layer 14 can comprise any semiconductor material, such as amorphous silicon, polysilicon, metal oxides (for example, IGZO and ZnO); in the present embodiment, the material of the semiconductor layer 14 is amorphous silicon (a-Si), and further doped with high concentration of P (with $PH_3$) to form $N^+$ a-Si at the top surface 141. However, in other embodiment of the present disclosure, the materials for the aforementioned components are not limited to the above listed examples.

In addition, in the present embodiment, the first metal conductive layer 12 is used as a gate electrode, the insulating layer 13 is used as a gate insulating layer, the first part 151 of the second metal conductive layer is used as a source electrode and the second part 152 thereof is used as a drain electrode. In the present disclosure, the first part 151 can be a source or drain electrode; if the first part 151 is defined as a source electrode, the second part 152 is defined as a drain electrode; and vice versa.

For the purpose that the TFT substrate has good switch performance and the display device has good optical property, the first part 151 of the second metal conductive layer in the display device of the present embodiment has special width or length.

As shown in FIGS. 2A and 2B, herein, a first extending direction De1 is defined as a direction that the first part 151 extends toward the second part 152 is defined as a first extending direction De1, as indicated by the arrow located on the first part 151; and the second direction De2 is defined as a direction vertical to the first extending direction De2. In addition, a first region R1 is defined as a region that the first part 151 overlaps the first metal conductive layer 12, and a second region R2 is defined as a region that the first part 151 overlaps the semiconductor layer 14. The first metal conductive layer 12 has a first edge 12a in the first region R1 that the first metal conductive layer 12 overlaps the first part 151, the semiconductor layer 14 has a semiconductor layer edge 14a in the second region R2 that the semiconductor layer 14 overlaps the first part 151; wherein the first extending direction De1 is defined as a connection line of a first central point P1 of the first edge 12a and a second central point P2 of the semiconductor layer edge 14a, as indicated by the arrow located on the first part 151.

As shown in FIGS. 2A and 2B, the first part 151 has a maximum length (b) in the first region R1 that the first part 151 overlaps the first metal conductive layer 12 along the first extending direction De1, the first part 151 has a maximum width (a) in the second region R2 that the first part 151 overlaps the semiconductor layer 14 along the second direction De2 vertical to the first extending direction De1, and the maximum length (b) is greater than the maximum width (a) and less than or equal to twice of the maximum width (a), i.e. a<b≤2a.

As shown in FIGS. 2A and 2B, when providing a voltage to the display device, the resistance of the first part 151 will influence the current passing through the channel region 153 (as shown in FIG. 3). Hence, in order to maintain enough current, the resistance of the first part 151 has to be reduced. In addition, the resistance of the first part 151 is inversely proportional to the area of the first part 151. As the area of the first part 151 increased, the resistance thereof is decreased; and as the area of the first part 151 decreased, the resistance thereof is increased. Furthermore, in order to ensure the current charge capacity of the TFT structure, the contact area between the first part 151 and the top surface 141 of the semiconductor layer 14 has to be large enough, and the total length of the edge of the first part 151 in the second region R2 that the first part 151 overlaps the semiconductor layer 14 (i.e. in FIGS. 2A and 2B, the total length of the edge of the first part 151 from the point P3 to the point P4 along the outline of the first part 151 near to the edge of the second part 15) has to be long enough. Therefore, based on the minimum current that can be tolerant to the TFT designs, i.e. based on the maximum resistance that can be tolerant, the minimum area of the second region R2 that first part 151 overlaps the semiconductor layer 14 has to satisfy the following equation (1):

$$A=(a/2)^2 \times \pi=(\pi/4) \times a^2 \approx 0.785 a^2 \qquad (1)$$

wherein, "A" is the area of the second region R2 that the first part 151 overlaps the semiconductor layer 14; "a" is the maximum width of the first part 151 in the second region R2 that the first part 151 overlaps the semiconductor layer 14 along a second direction De2 vertical to the first extending direction De1; and "π" is ratio of the circumference of a circle to its diameter.

However, the parasitic capacitance generated between the first part 151 and the first metal conductive layer 12 may influence the feedthrough voltage. If the feedthrough voltage is too large, image sticking or flicker may be occurred, resulting in the display quality decreased. Hence, the overlapping area of the first region R1 between the first part 151 and the first metal conductive layer 12 cannot be too large, to maintain the display quality of the display device.

Generally, in the liquid crystal display device, the relation between the feedthrough voltage and the parasitic capacitance is presented by the following equation (2):

$$\Delta V=(V_{gh}-V_{gl}) \times C_{gs}/(C_{gs}+C_{lc}) \qquad (2)$$

where "ΔV" is the feedthrough voltage; "$V_{gh}$" is gate high voltage; "$V_{gl}$" is gate low voltage; "$C_{lc}$" is the capacitance of the liquid crystal layer; and "$C_{gs}$" is the parasitic capacitance occurred in the first region R1 between the first part 151 and the first metal conductive layer 12. As shown in the equation (2), the feedthrough voltage is increased as the parasitic capacitance increased. In addition, when the overlapping area of the first region R1 between the first part 151 and the first metal conductive layer 12 is increased, the parasitic capacitance occurred therebetween is also increased. Hence, the overlapping area of the first region R1 between the first part 151 and the first metal conductive layer 12 is proportional to the feedthrough voltage. Therefore, to obtain a permitted feedthrough voltage, it is necessary to have a maximum overlapping area between the first part 151 and the first metal conductive layer 12.

More specifically, in the case that the minimum area of the second region R2 that first part 151 overlaps the semiconductor layer 14 satisfy the equation (1), the obtained feedthrough voltage is defined as 1 times of feedthrough voltage. In general, the feedthrough voltage variation between 1 to 3 times of feedthrough voltage is acceptable, because the optical quality of the display device can be maintained. In order to maintain the feedthough voltage variation within 3 times of the feedthrough voltage, the maximum area of the first region R1 between the first part 151 and the first metal conductive layer 12 has to satisfy the following equation (3):

$$A1=(2a) \times a=2 \times a^2 \qquad (3)$$

wherein, "A1" is the area of the first region R1 between the first part 151 and the first metal conductive layer 12; "a" is the maximum width of the first part 151 in a second region R2 that the first part 151 overlaps the semiconductor layer 14 along a second direction De2 vertical to the first extending direction De1.

Figure 4:
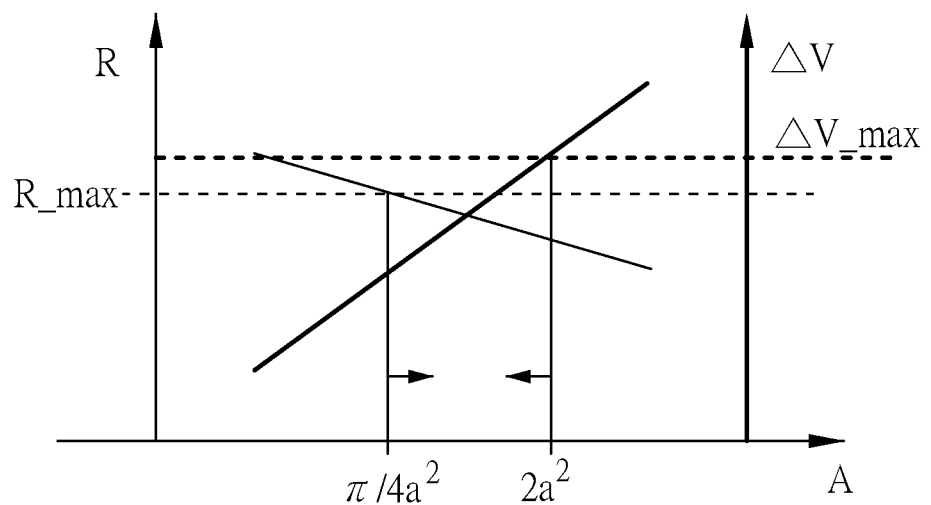
FIG. 4 is a diagram showing a relation of a resistance and a feedthrough voltage vs. an area of a second region of a first part and a semiconductor layer in a TFT structure according to an embodiment of the present disclosure.

FIG. 4 is a diagram showing the relation of the resistance and the feedthrough voltage vs. the area of the second region R2 of the first part 151 and the semiconductor layer 14 in the TFT structure of the present embodiment. As shown in FIG. 4, the resistance of the first part 151 is inversely proportional to the area of the first part 151. As the area of the first part 151 increased, the resistance thereof is decreased; and as the area of the first part 151 decreased, the resistance thereof is increased. In addition, the area of the first region R1 between the first part 151 and the first metal conductive layer 12 is proportional to the feedthrough voltage. As the overlapping area thereberween increased, the feedthrough voltage is increased; and as the overlapping area thereberween decreased, the feedthrough voltage is decreased. In order to provide enough current and prevent the feedthrough voltage too large at the same time, the area of the second region R2 between the first part 151 and the semiconductor layer 14 has to simultaneously satisfy the minimum area defined in the equation (1) and the maximum area defined in the equation (2). When the area of the second region R2 between the first part 151 and the semiconductor layer 14 simultaneously satisfy the minimum area defined in the equation (1) and the maximum area defined in the equation (2), a maximum resistance R_max and a maximum feedthrough voltage ΔV_max can be obtained.

In the present embodiment, as shown in FIG. 2, the maximum width of the first part 151 in a second region R2 that the first part 151 overlaps the semiconductor layer 14 along a second direction De2 vertical to the first extending direction De1 is between 1 μm to 10 μm; or between 2 μm to 6 μm. In addition, the area of the second region R2 that the first part 151 overlaps the semiconductor layer 14 is between 0.78 μm² to 200 μm²; or between 3.14 μm² to 72 μm². Furthermore, the length of the edge of the first part 151 in the second region R2 that the first part 151 overlaps the semiconductor layer 14 is between 1.57 μm to 15.70 μm; or between 3.14 μm to 9.42 μm.

It should be noted that FIG. 4 is a perspective view showing the relation of the resistance and the feedthrough voltage vs. the area of the second region R2 of the first part 151 and the semiconductor layer 14, which is used to explain the situation that the resistance is decreased and the feedthrough voltage is increased as the area of the second region R2 is increased. However, in fact, the relation of the resistance and the feedthrough voltage vs. the area of the second region R2 is not certainly identical to the linear relation shown in FIG. 4.

Figure 5:
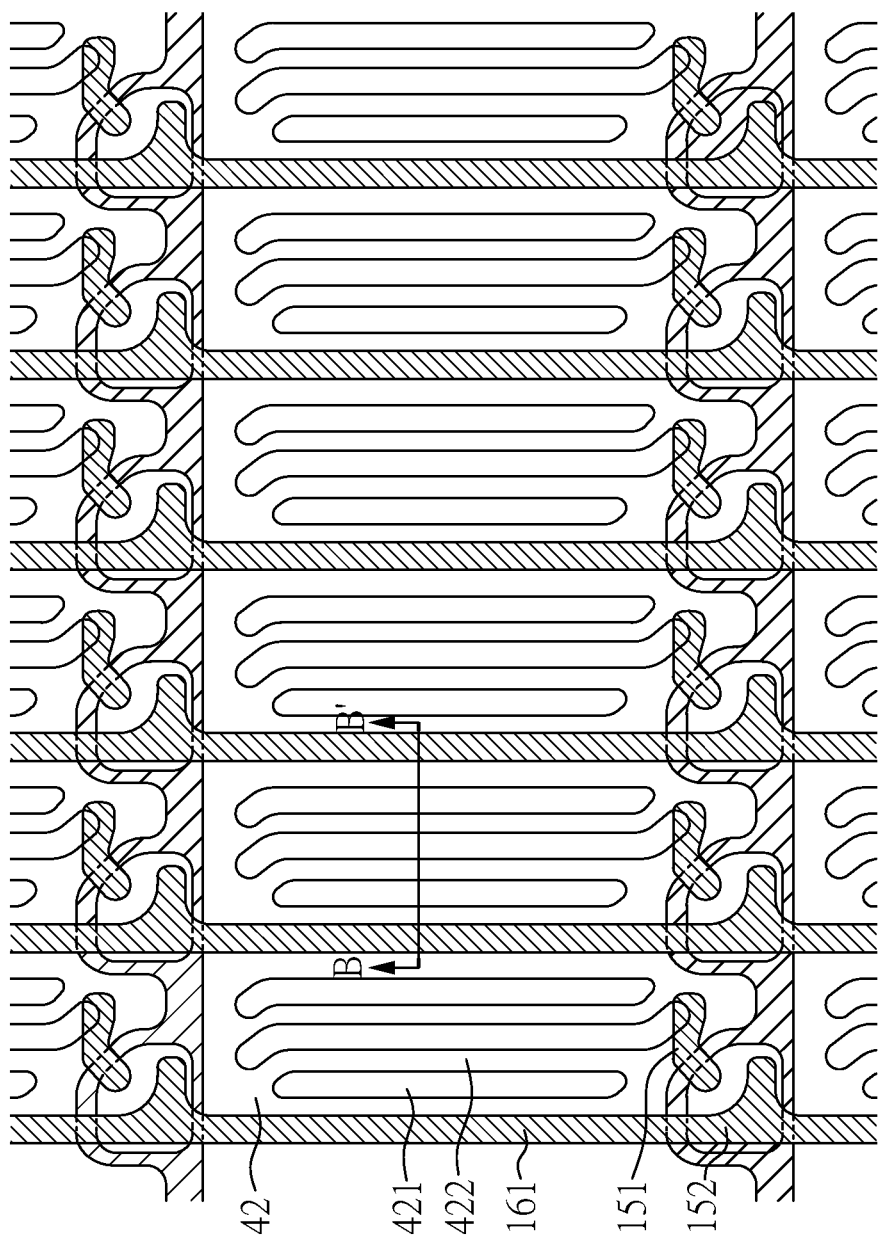
FIG. 5 is a perspective view showing components on a substrate of a display device according to an embodiment of the present disclosure.
Figure 6:
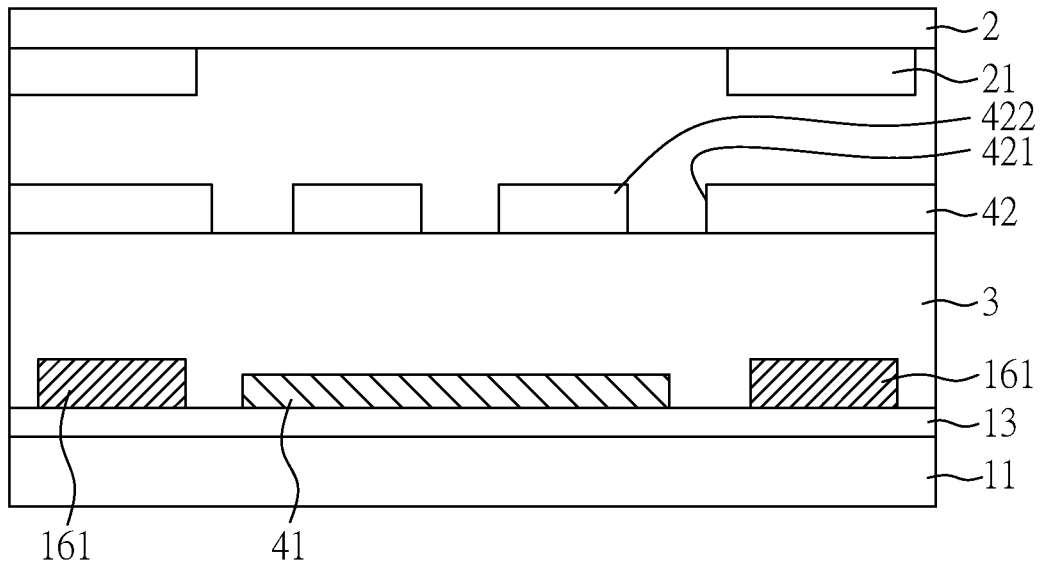
FIG. 6 is a cross-sectional view of a display device according to an embodiment of the present disclosure.

Besides, in an embodiment of the present disclosure, the first part 151 and the transparent conductive layer also have designed structures. FIG. 5 is a perspective view showing components on the substrate of the display device of the present embodiment; and FIG. 6 is a cross-sectional view of the display device along the section line B-B' shown in FIG. 5. As shown in FIGS. 5 and 6, the display device of the present embodiment further comprises a transparent conductive layer 42, the second metal conductive layer (including the first part 151 and the second part 152) further comprises a data line 161, and the data line 161 electrically connects to the second part 152. In the present embodiment, the display device further comprises another transparent conductive layer 41 disposed below the transparent conductive layer 42. Herein, one of the transparent conductive layers 41, 42 is used as a common electrode layer and the other is used as a pixel electrode layer. In the present embodiment, the transparent conductive layer 41 is used as a pixel electrode layer and the transparent conductive layer 42 is used as a common electrode layer. Furthermore, the display device of the present embodiment further comprises a black matrix layer 21 disposed on the counter substrate 2 and overlapping with the data line 161. In other embodiment of the present disclosure, the black matrix layer may be disposed on the substrate 11; in this case, the substrate 11 is a BOA (black matrix on array) substrate.

Figure 7A:
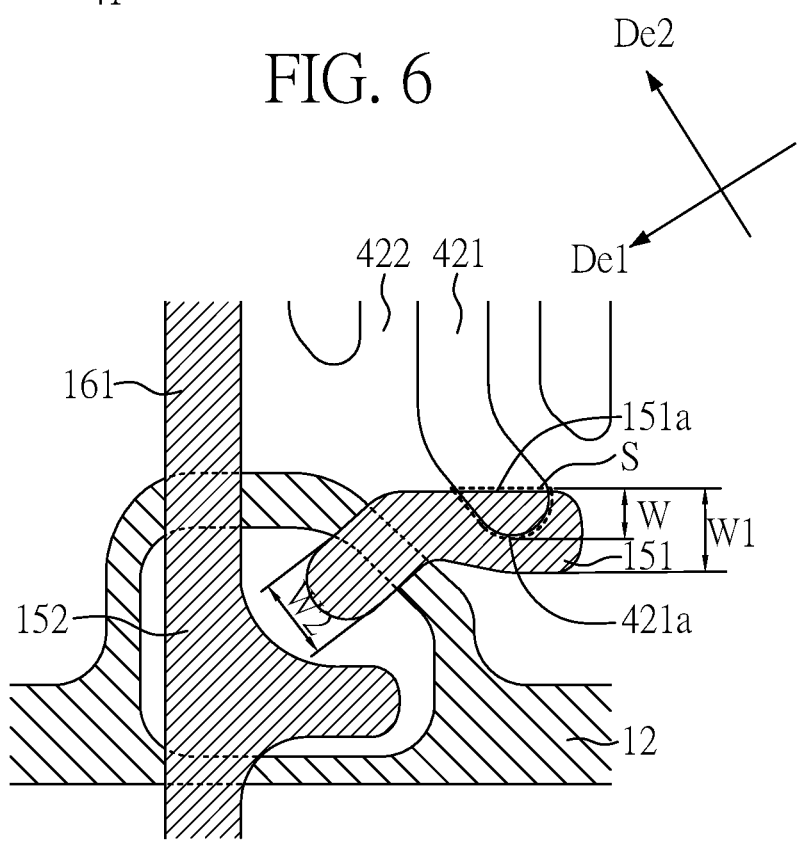
FIGS. 7A and 7B are top views showing a TFT structure and a transparent conductive layer disposed thereon according to an embodiment of the present disclosure.
Figure 7B:
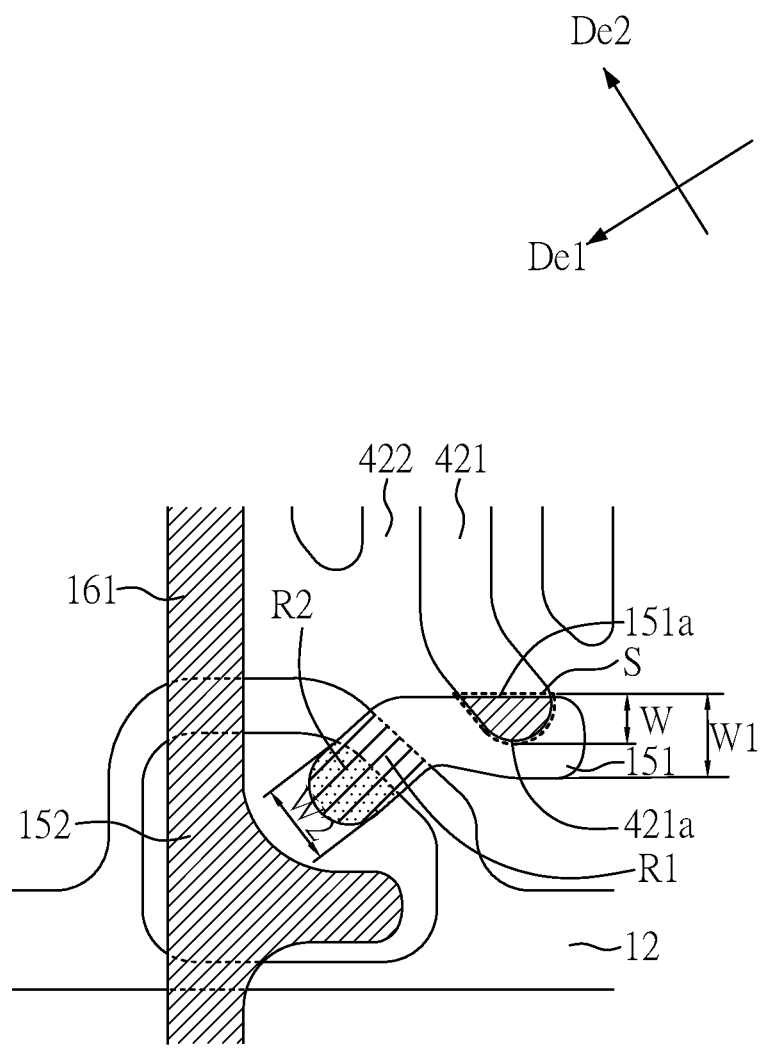

Herein, the structure relation between the first part 151 and the transparent conductive layer 42 in the display device of the present embodiment is illustrated in detail. FIGS. 7A and 7B are top views showing the TFT structure and the transparent conductive layer disposed thereon; wherein FIGS. 7A and 7B are the same top view except the filling patterns are different. As shown in FIGS. 5 to 7B, the transparent conductive layer 42 is disposed above the second metal conductive layer and substantially parallel to the data line 161. More specifically, the transparent conductive layer 42 comprises plural strip electrodes 422 and plural slits 421 alternately arranged, and the slits 421 substantially parallel to the data lines 161. Herein, the term "substantially parallel" refers to an angle included between the longitude extending directions of the slits 421 and the data line 161 is 0 to ±5 degree.

As shown in FIGS. 6 and 7A, in the display device of the present embodiment, there is an overlapping region between the second metal conductive layer and the transparent conductive layer 42. More specifically, the second metal conductive layer partially overlaps with at least one of the slits 421. Herein, the region that the second metal conductive layer overlapping the at least one of the slits 421 has a width W, which is more than 0 and less than 8 μm. More specifically, the first part 151 of the second metal conductive layer has a shielding region S overlapping the at least one of the slits 421; wherein, in the shielding region S, the slit 421 has a slit edge 421a, the first part 151 has a second edge 151a, and a distance (i.e. the width W) between the slit edge 421a and the second edge 151a is more than 0 and less than 8 μm. Herein, the distance (i.e. the width W) between the slit edge 421a and the second edge 151a is observed at a normal direction of the substrate 11, as shown in FIGS. 6 and 7A.

Figure 8:
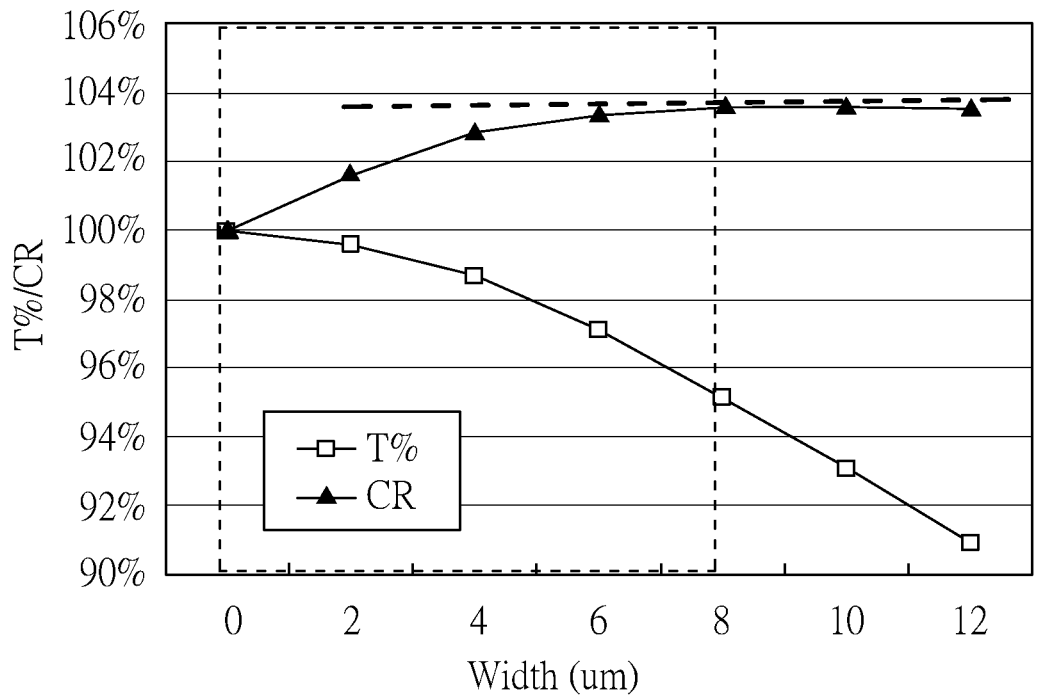
FIG. 8 is a diagram showing a relation of transmittance and contrast vs. a distance between a slit edge of a transparent conductive layer and a second edge of a first part in a display device according an embodiment of the present disclosure.

FIG. 8 is a diagram showing a relation of transmittance (T %) and contrast (CR) vs. the distance (i.e. the width W) between the slit edge 421a of the transparent conductive layer 42 and the second edge 151a of the first part 151 in the display device of the present embodiment. Herein, the transmittance and contrast detected in a condition that the width W is 0 μm in the pixel is set to be 100%, and the transmittance and contrast change when the width W is increased from 0 μm to 12 μm is examined. As shown in FIG. 8, as the width W increased, the transmittance is decreased but the contrast is increased. However, the contrast is not significant improved but the transmittance is still gradually decreased, when the width W is more than 8 μm. Hence, in the present embodiment, the distance (i.e. the width W) between the slit edge 421a and the second edge 151a is more than or equal to 0 μm and less than 8 μm (0 μm≤W<8 μm).

As shown in FIGS. 7A and 8, the liquid crystal molecules may not properly tilt at the region above the slits 421, resulting in dark lines occurred. If there is a shielding region S between the first part 151 of the second metal conductive layer and the at least one of the slits 421, this shielding region S can cover the region that the dark lines are easily occurred; and therefore, the contrast at this region can be improved. Even though the transmittance at this shielding region S is decreased, the decreased level of the transmittance at this shielding region S is very small. However, if the area of the shielding region S is too large, i.e. the distance (i.e. the width W) between the slit edge 421a and the second edge 151a is more than 8 μm, the shielding region S may influence the light emitting region. Not only the dark region but also the bright region are shielded by the shielding region S, and in this case, the transmittance is decreased and the contrast is no longer improved. Hence, when the distance (i.e. the width W) between the slit edge 421a and the second edge 151a in the shielding region S is more than or equal to 0 μm and less than 8 μm, the optical quality of the display device can be improved.

Besides, in an embodiment of the present disclosure, the first part also has a designed structure. As shown in FIGS. 7A and 2B, the first part 151 has a first maximum breadth W1 outside the first metal conductive layer 12 (i.e. the region that the first metal conductive layer 12 does not overlap the first part 151, in other word, the region of the first conductive layer 12 without the first region R1), the first part 151 has a second maximum breadth W2 inside the first metal conductive layer 12, and the first maximum breadth W1 is greater than the second maximum breadth W2. A capacitance has to be formed between the first part 151 outside the first metal conductive layer 12 and the transparent conductive layer 42, so the first maximum breadth W1 has to be increased. For the first part 151 inside the first metal conductive layer 12, because the first part 151 has to meet the aforementioned requirement for the charge capacity and the area of the first part 151 cannot be too large to prevent the large feedthrough voltage, the second maximum breadth W2 (which is equal to the maximum width a shown in FIG. 2) cannot be too large.

Figure 9:
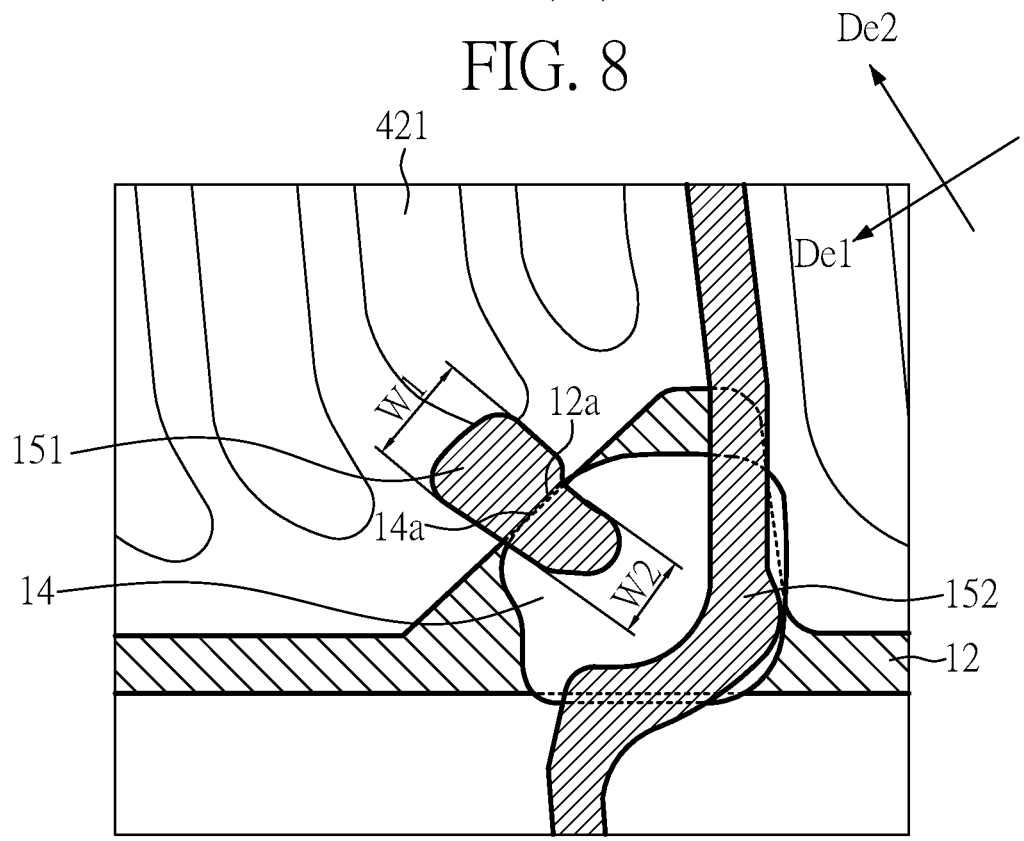
FIG. 9 is a top view of a TFT structure according to another embodiment of the present disclosure.

FIG. 9 is a top view of a TFT structure according to another embodiment of the present disclosure. In the display device of the present embodiment, the features are similar to those illustrate in the aforesaid embodiment, except that the first edge 12a of the first metal conductive layer 12 under the first part 151 is very close to the semiconductor layer edge 14a of the semiconductor layer 14.

In the present disclosure, the display device as illustrated in the aforementioned embodiments can be a liquid crystal display device, an organic light emitting diode display device, a light emitting diode display device or a quantum dot display device. In addition, the display device as illustrated in the aforementioned embodiments can be co-operated with a touch panel to form a touch display device. Meanwhile, the display devices and the touch display devices provided by the aforementioned embodiments can be applied to any electronic device for displaying images and touch sensing, for example, monitors, mobile phones, notebooks, cameras, video cameras, music players, navigation systems, and televisions.

Although the present disclosure has been explained in relation to its embodiment, it is to be understood that many other possible modifications and variations can be made without departing from the spirit and scope of the disclosure as hereinafter claimed. In addition, the designed values mentioned in the above embodiments can be used in combination without departing from the spirit and scope of the disclosure as hereinafter claimed.

What is claimed is:

1. A display device, comprising:
   a substrate;
   a first metal conductive layer disposed on the substrate;
   a semiconductor layer disposed on the first metal conductive layer and having a top surface; and
   a second metal conductive layer disposed on the top surface, wherein the second metal conductive layer comprises a data line, a first part and a second part, the first part is separated from the second part, the data line is electrically connected to the second part, and the data line has a data extending direction, wherein the data extending direction is an extending direction of the data line,
   wherein a first extending direction is defined as a direction that the first part extends toward the second part, a first region is defined as a region that the first part overlaps the first metal conductive layer, the first part has a first maximum breadth outside the first region along the data extending direction, the first part has a second maximum breadth inside the first region along a direction substantially perpendicular to the first extending direction, and the first maximum breadth is greater than the second maximum breadth.

2. The display device of claim 1, wherein the first part has a curved edge.

3. The display device of claim 1, wherein a second region is defined as a region that the first part overlaps the semiconductor layer, and the second region has a curved edge.

4. The display device of claim 1, wherein the first part has a curved edge outside the first region.

5. The display device of claim 1, wherein the first metal conductive layer has a first edge in the first region, the semiconductor layer has a semiconductor layer edge in the second region, and the first extending direction is defined as a connection line of a first central point of the first edge and a second central point of the semiconductor layer edge.

6. The display device of claim 1, further comprising a transparent conductive layer disposed on the second metal conductive layer.

7. The display device of claim 6, wherein there is an overlapping region between the second metal conductive layer and the transparent conductive layer.

8. The display device of claim 6, wherein the overlapping region has a width more than 0 µm and less than 8 µm along the data extending direction.

9. The display device of claim 6, wherein the transparent conductive layer comprises plural strip electrodes and plural slits alternately arranged, and the second metal conductive layer partially overlaps with at least one of the plural slits.

10. The display device of claim 9, wherein the plural slits are substantially parallel to the data line.

11. The display device of claim 9, wherein the first part partially overlaps with at least one of the plural slits.

12. The display device of claim 9, wherein the first part has a shielding region overlapping at least one of the plural slits; wherein, in the shielding region, the slit has a slit edge, the first part has a second edge, and a distance between the slit edge and the second edge is more than or equal to 0 µm and less than 8 µm along the data extending direction.

13. The display device of claim 9, wherein at least one of the plural slits has a curved edge.

14. The display device of claim 1, which is a liquid crystal display device or a light emitting diode display device.

15. The display device of claim 1, wherein the substrate comprises a flexible substrate.

16. The display device of claim 1, wherein the first metal conductive layer is protruded outside two sides of the second part in a top view of the substrate.

17. The display device of claim 1, wherein the semiconductor layer is protruded outside two sides of the second part in a top view of the substrate.

18. The display device of claim 1, wherein the second part has a curved edge.

* * * * *